United States Patent
Blatchford (10) Patent No.: US 8,461,038 B2
(45) Date of Patent: Jun. 11, 2013

(54) TWO-TRACK CROSS-CONNECTS IN DOUBLE-PATTERNED METAL LAYERS USING A FORBIDDEN ZONE

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/410,236

(22) Filed: Mar. 1, 2012

(65) Prior Publication Data

US 2012/0225552 A1 Sep. 6, 2012

Related U.S. Application Data

(60) Provisional application No. 61/448,437, filed on Mar. 2, 2011.

(51) Int. Cl.
*H01L 21/3213* (2006.01)
*H01L 21/4763* (2006.01)
*H01L 21/28* (2006.01)

(52) U.S. Cl.
USPC ........... 438/622; 438/637; 438/708; 438/720; 257/E21.576; 257/E21.577

(58) Field of Classification Search
USPC .......... 438/622, 637, 708, 720; 257/E21.576, 257/E21.577
See application file for complete search history.

(56) References Cited

U.S. PATENT DOCUMENTS

| | | | |
|---|---|---|---|
| 6,403,413 B2* | 6/2002 | Hayano et al. | 438/238 |
| 6,541,396 B2* | 4/2003 | Kawahara et al. | 438/780 |
| 6,632,744 B2* | 10/2003 | Imai et al. | 438/692 |
| 6,653,238 B2* | 11/2003 | Kim et al. | 438/700 |
| 7,233,052 B2* | 6/2007 | Tamaoka et al. | 257/522 |
| 7,351,666 B2* | 4/2008 | Furukawa et al. | 438/736 |
| 7,531,456 B2* | 5/2009 | Kwon et al. | 438/671 |
| 7,534,723 B2* | 5/2009 | Park et al. | 438/669 |
| 7,615,497 B2* | 11/2009 | Bok et al. | 438/736 |
| 7,694,269 B2* | 4/2010 | Savithri et al. | 716/50 |

(Continued)

OTHER PUBLICATIONS

James W. Blatchford, Steven L. Prins, Scott W. Jessen, Thuc Dam, KiHo Baik, Linyong Pang and Bob Gleason, "Litho/Design Co-optimization and Area Scaling for the 22-nm Logic Node", Presented at the China Semiconductor International Conference 2010, Mar. 16-18, 2010, Shanghai, China, ECS Transactions 27 (1), 449 (2010). Published by the Electrochemical Society, Pennington, NJ.

*Primary Examiner* — Mary Wilczewski

(74) *Attorney, Agent, or Firm* — Jacqueline J. Garner; Wade J. Brady, III; Frederick J. Telecky, Jr.

(57) ABSTRACT

An integrated circuit is formed by forming a first interconnect pattern in parallel route tracks, and forming a second interconnect pattern in alternating parallel route tracks. The first interconnect pattern includes a first lead pattern in the parallel route tracks, and the second interconnect pattern includes a second lead pattern in an immediately adjacent route track. The first interconnect pattern includes a crossover pattern which extends from the first lead pattern to the second lead pattern. An exclusion zone in the route track immediately adjacent to the crossover pattern is free of a lead pattern for a lateral distance of two to three times the width of the crossover pattern. Metal interconnect lines are form in the first interconnect pattern and the second interconnect pattern areas, including a continuous metal crossover line through the crossover pattern area. The exclusion zone is free of the metal interconnect lines.

16 Claims, 9 Drawing Sheets

U.S. PATENT DOCUMENTS

| | | | |
|---|---|---|---|
| 7,829,168 B2* | 11/2010 | Zhang et al. | 428/64.1 |
| 7,897,058 B2* | 3/2011 | Van Haren et al. | 216/41 |
| 7,928,007 B2* | 4/2011 | Petti | 438/645 |
| 8,048,762 B2* | 11/2011 | Ohuchi | 438/424 |
| 8,176,443 B2* | 5/2012 | Rathsack et al. | 716/50 |
| 8,309,462 B1* | 11/2012 | Yoshida et al. | 438/672 |
| 8,309,469 B2* | 11/2012 | Kajiwara | 438/717 |
| 8,372,743 B2* | 2/2013 | Blatchford | 438/622 |
| 2002/0014697 A1* | 2/2002 | Tamaoka et al. | 257/758 |
| 2002/0025690 A1* | 2/2002 | Kawahara et al. | 438/780 |
| 2003/0146495 A1* | 8/2003 | Tamaoka et al. | 257/618 |
| 2005/0161824 A1* | 7/2005 | Tamaoka et al. | 257/758 |
| 2007/0099424 A1* | 5/2007 | Rathsack et al. | 438/689 |
| 2007/0148968 A1* | 6/2007 | Kwon et al. | 438/671 |
| 2007/0178389 A1* | 8/2007 | Yoo | 430/5 |
| 2008/0081461 A1* | 4/2008 | Lee et al. | 438/637 |
| 2008/0203518 A1* | 8/2008 | Savithri et al. | 257/499 |
| 2009/0300567 A1* | 12/2009 | Rathsack et al. | 716/8 |
| 2012/0131522 A1* | 5/2012 | Blatchford | 716/55 |
| 2012/0148942 A1* | 6/2012 | Blatchford | 430/5 |
| 2012/0223439 A1* | 9/2012 | Blatchford et al. | 257/774 |
| 2012/0225550 A1* | 9/2012 | Blatchford | 438/637 |
| 2012/0225551 A1* | 9/2012 | Blatchford | 438/637 |
| 2012/0225552 A1* | 9/2012 | Blatchford | 438/637 |
| 2012/0331425 A1* | 12/2012 | Blatchford | 716/52 |

* cited by examiner

TWO-TRACK CROSS-CONNECTS IN DOUBLE-PATTERNED METAL LAYERS USING A FORBIDDEN ZONE

CROSS-REFERENCE TO RELATED APPLICATIONS

This application claims the benefit of priority under U.S.C. §119(e) of U.S. Provisional Application 61/448,437, filed Mar. 2, 2011).

The following applications are related and hereby incorporated by reference:

Patent application Ser. No. 13/410,241, filed Mar. 1, 2012 entitled "TWO-TRACK CROSS-CONNECT IN DOUBLE-PATTERNED STRUCTURE USING RECTANGULAR VIA,"

Patent application Ser. No. 13/410,188, filed Mar. 1, 2012 entitled "PATTERN-SPLIT DECOMPOSITION STRATEGY FOR DOUBLE-PATTERNED LITHOGRAPHY PROCESS," and Patent application Ser. No. 13/410,145, filed Mar. 1, 2012, now U.S. Pat. No. 8,372,743, entitled "HYBRID PITCH-SPLIT PATTERN-SPLIT LITHOGRAPHY PROCESS."

FIELD OF THE INVENTION

This invention relates to the field of integrated circuits. More particularly, this invention relates to photolithography processes for forming integrated circuits.

BACKGROUND OF THE INVENTION

Integrated circuits may be formed using photolithography processes with illuminations sources having wavelengths more than twice a desired pitch of metal interconnect lines in the integrated circuits. Attaining desired tradeoffs between fabrication costs and fabrication yield may be difficult. For example, technology nodes at and beyond the 28 nanometer node using 193 nanometer illumination sources may require more than one pattern step to obtain desired first metal interconnect layouts. Forming crossovers between adjacent parallel route tracks in the first metal level with desired lateral dimensions may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by a process of forming a first interconnect pattern of interconnect leads in a first plurality of parallel route tracks, and forming a second interconnect pattern of interconnect leads in a second plurality of parallel route tracks, in which the second plurality of route tracks are alternated with the first plurality of route tracks. The first interconnect pattern includes a first lead pattern in an instance of the first plurality of parallel route tracks, and the second interconnect pattern includes a second lead pattern in an instance of the second plurality of parallel route tracks, such that the instance of the first plurality of parallel route tracks containing the first lead pattern is immediately adjacent to the instance of the second plurality of parallel route tracks containing the second lead pattern. The first interconnect pattern includes a crossover pattern which extends from the first lead pattern to the second lead pattern. An exclusion zone in an instance of the first plurality of parallel route tracks immediately adjacent to the second interconnect element pattern and opposite from the crossover pattern is free of a lead pattern for a lateral distance of two to three times a width of the crossover pattern. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. A metal crossover element is formed by the metal interconnect formation process which electrically connects the first lead and the second lead, to form a continuous metal crossover line from the first plurality of parallel route tracks to the second plurality of parallel route tracks. The exclusion zone is free of interconnect metal from the metal interconnect formation process.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by a process of forming a first interconnect pattern in a first plurality of parallel route tracks, and forming a second interconnect pattern in a second plurality of parallel route tracks, in which the second plurality of route tracks are alternated with the first plurality of route tracks. The first interconnect pattern includes a first lead pattern in an instance of the first plurality of parallel route tracks, and the second interconnect pattern includes a second lead pattern in an instance of the second plurality of parallel route tracks, such that the instance of the first plurality of parallel route tracks containing the first lead pattern is immediately adjacent to the instance of the second plurality of parallel route tracks containing the second lead pattern. The first interconnect pattern includes a crossover pattern which extends from the first lead pattern to the second lead pattern. An exclusion zone in an instance of the first plurality of parallel route tracks immediately adjacent to the crossover pattern is free of a lead pattern for a lateral distance of two to three times a width of the crossover pattern. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. A metal crossover element is formed by the metal interconnect formation process which electrically connects the first lead and the second lead, to form a continuous metal crossover line from the first plurality of parallel route tracks to the second plurality of parallel route tracks. The exclusion zone is free of interconnect metal from the metal interconnect formation process.

Figure 1A:
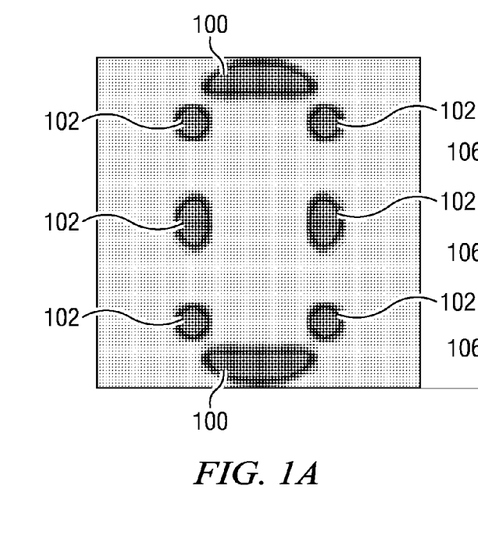
FIG. 1A through FIG. 1C depict exemplary illumination sources for photolithographic processes which may be used to form integrated circuits according to embodiments described herein.
Figure 1B:
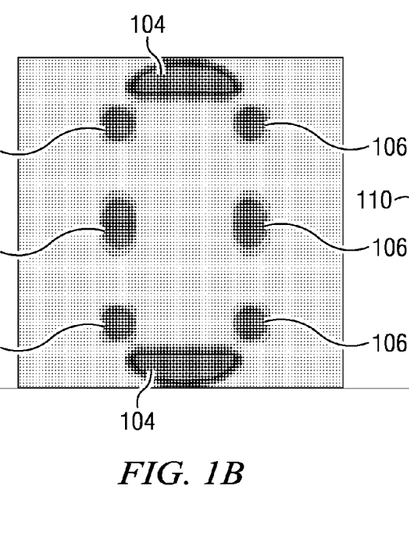
Figure 1C:
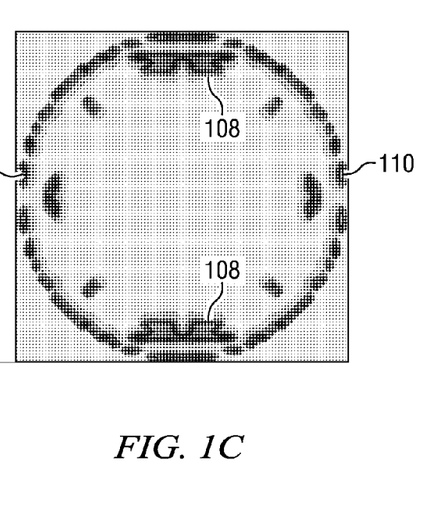

FIG. 1A through FIG. 1C depict exemplary illumination sources for photolithographic processes which may be used to form integrated circuits according to embodiments described herein. FIG. 1A depicts an off-axis illumination source with a moderate dipole component; the emitting area is configured in two large dipole regions 100 along the vertical direction and smaller source regions 102 along the horizontal and diagonal directions. FIG. 1B depicts an off-axis illumination source with a strong dipole component; the emitting area is configured in two large dipole regions 104 along the vertical direction and smaller, weaker source regions 106 along the horizontal and diagonal directions. FIG. 1C depicts an off-axis illumination source with a dipole component; the emitting area is configured in two dipole regions 108 along the vertical direction and a distributed annular region 110.

Figure 2A:
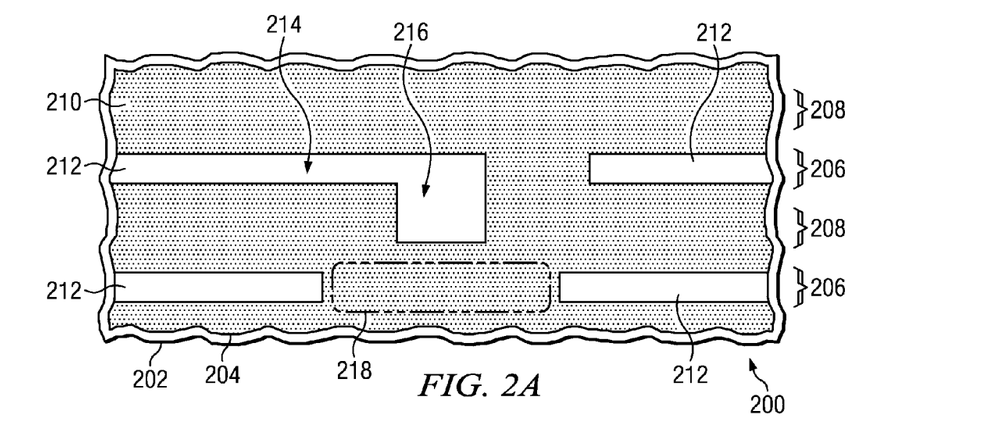
FIG. 2A through FIG. 2E are top views of an integrated circuit formed according a first embodiment using a damascene metal process and an illumination source with a dipole component, depicted in successive stages of fabrication.

FIG. 2A through FIG. 2E are top views of an integrated circuit formed according a first embodiment using a damascene metal process and an illumination source with a dipole component, depicted in successive stages of fabrication. The instant embodiment uses an illumination source with a dipole component, for example any of the illuminations sources described in reference to FIG. 1A through FIG. 1C. Referring to FIG. 2A, the integrated circuit 200 is formed in and on a semiconductor substrate 202, which may be, for example, a single crystal silicon wafer, a silicon wafer with silicon-germanium regions, a silicon-on-insulator (SOI) wafer, a hybrid orientation technology (HOT) wafer with regions of different crystal orientations, a silicon wafer with a gallium nitride (GaN) epitaxial layer, or other material appropriate for fabrication of the integrated circuit 200.

A dielectric layer 204 is formed over the substrate 202. The dielectric layer 204 may be a stack of dielectric sub-layers, and may include, for example a pre-metal dielectric (PMD) layer and an inter-level dielectric (ILD) layer. The PMD layer may include a PMD liner, a PMD main layer, and an optional PMD cap layer, not shown. The PMD liner may include silicon nitride or silicon dioxide, 10 to 100 nanometers thick, deposited by plasma enhanced chemical vapor deposition (PECVD) on an existing top surface of the integrated circuit 200. The PMD main layer may be a layer of silicon dioxide formed by a high aspect ration process (HARP) followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

The ILD layer may include, for example, an etch stop layer of 5 to 25 nanometers of silicon nitride, silicon carbide, or silicon carbide nitride, a main layer of 100 to 200 nanometers of low-k dielectric material such as organo-silicate glass (OSG), carbon-doped silicon oxides (SiCO or CDO) or dielectric material formed from methylsilsesquioxane (MSQ), or possibly ultra low-k dielectric material such as porous OSG (p-OSG), and a cap layer of 10 to 40 nanometers of silicon nitride, silicon carbide nitride or silicon carbide.

Areas for a first plurality 206 and a second plurality 208 of parallel route tracks are defined over the integrated circuit 200. Instances of the first plurality 206 of parallel route tracks alternate with instances of the second plurality 208 of parallel route tracks.

A first interconnect pattern 210, depicted in FIG. 2A with a stipple pattern, is formed of photoresist over the dielectric layer 204 which creates a first plurality of exposed areas 212 in the first plurality 206 of parallel route tracks. The first plurality of exposed areas 212 includes a first lead pattern 214 in an instance of the first plurality 206 of parallel route tracks. The first interconnect pattern 210 further includes a crossover pattern 216 which extends from the first lead pattern 214 to an instance of the second plurality 208 of parallel route tracks immediately adjacent to the first lead pattern 214. An exclusion zone 218 is defined in an instance of the first plurality 206 of parallel route tracks immediately adjacent to the crossover pattern 216, and extends for a lateral distance of two to three times a width of the crossover pattern 216 in a direction parallel to the first plurality 206 and second plurality 208 of parallel route tracks. The exclusion zone 218 is free of the exposed areas 212.

In the instant embodiment, due to the dipole component of the illumination sources used to produce the first interconnect pattern 210, the width of the crossover pattern 216 in the direction parallel to the first plurality 206 and second plurality 208 of parallel route tracks may be three to four times a minimum width of the first lead pattern 214. In one version of the instant embodiment, the illumination source may provide 193 nanometer radiation, and the minimum width of the first lead pattern 214 may be 19 to 21 nanometers.

In one version of the instant embodiment, the first interconnect pattern 210 may be formed of novolak resin based photoresist and developed using a positive tone develop process such as exposure to an alkaline aqueous developing solution. In another version, the first interconnect pattern 210 may be formed of photoresist and developed using a negative tone develop process.

Figure 2B:
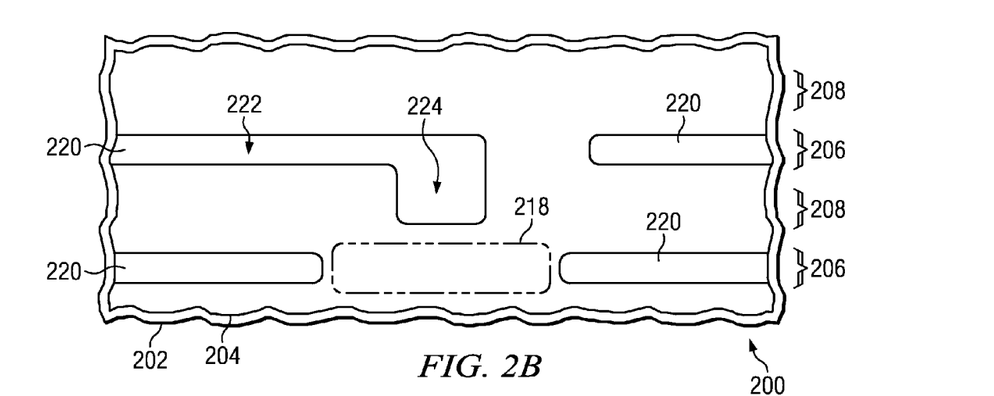

Referring to FIG. 2B, a first interconnect trench etch process is performed which removes dielectric material from the dielectric layer 204 in the first plurality of exposed areas 212 to form a first plurality of interconnect trenches 220. A first lead trench 222 is formed by the first interconnect trench etch process in the first lead pattern 214. A crossover trench 224 is formed by the first interconnect trench etch process in the crossover pattern 216. The first interconnect pattern 210 is removed after the first interconnect trench etch process is completed, for example by exposing the integrated circuit 200 to an oxygen containing plasma, followed by a wet cleanup to remove any organic residue from the top surface of the dielectric layer 204.

Figure 2C:
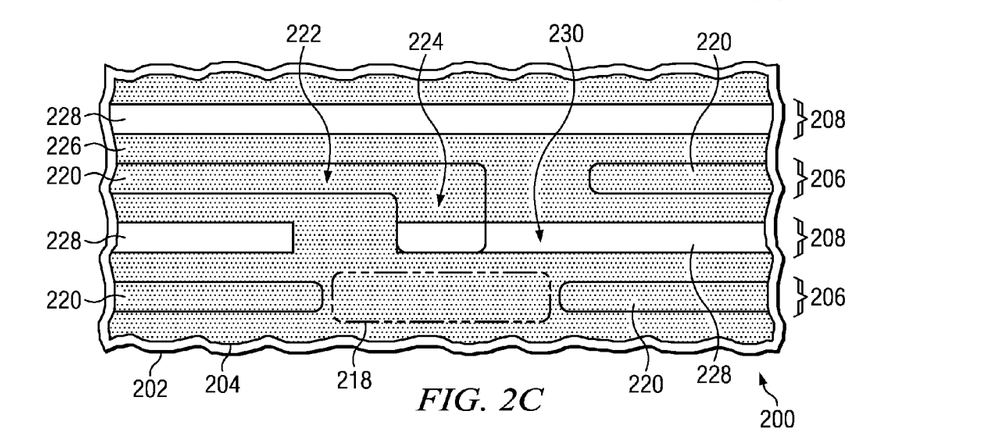

Referring to FIG. 2C, a second interconnect pattern 226, depicted in FIG. 2C with a stipple pattern, is formed of photoresist over the dielectric layer 204 which creates a second plurality of exposed areas 228 in the second plurality 208 of parallel route tracks. The second plurality of exposed areas 228 includes a second lead pattern 230 which extends to the crossover trench 224.

Figure 2D:
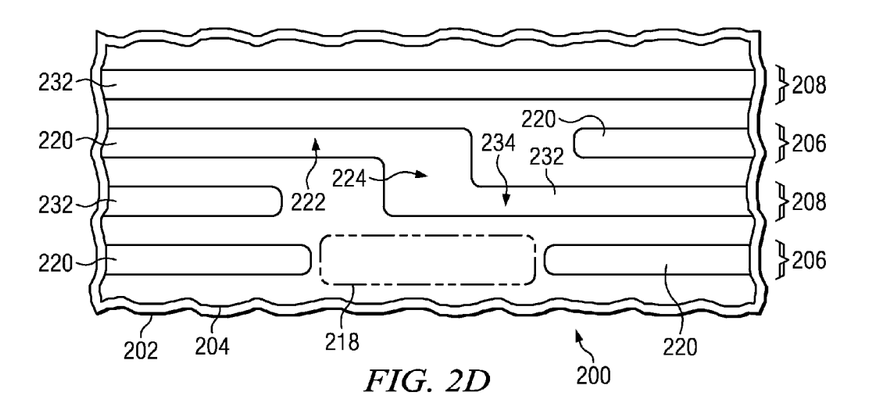

Referring to FIG. 2D, a second interconnect trench etch process is performed which removes dielectric material from the dielectric layer 204 in the second plurality of exposed areas 228 to form a second plurality of interconnect trenches 232. A second lead trench 234 is formed by the second interconnect trench etch process in the second lead pattern 230. The first lead trench 222, the crossover trench 224 and the second lead trench 234 form a continuous trench. The second interconnect pattern 226 is removed after the second interconnect trench etch process is completed, for example as described in reference to FIG. 2B.

Figure 2E:
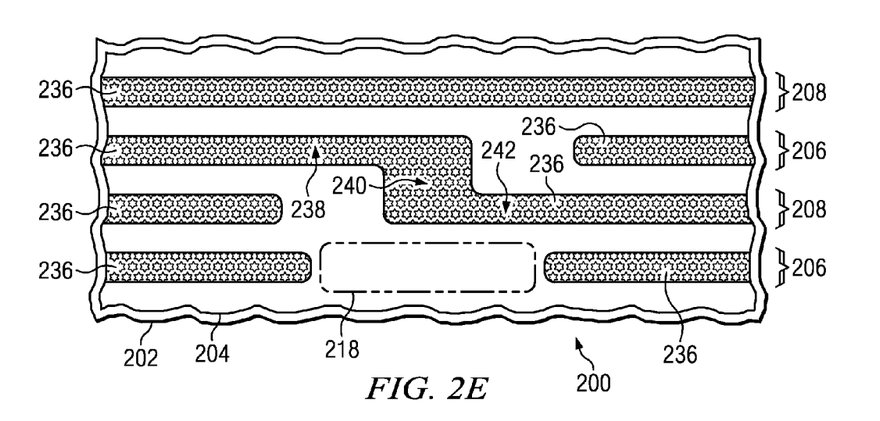

Referring to FIG. 2E, a damascene metal interconnect formation process is performed which forms metal interconnect lines 236 in the first plurality of interconnect trenches 220, the crossover trench 224 and the second plurality of interconnect trenches 232. The metal interconnect lines 236 are depicted in FIG. 2E with a star hatch pattern. The damascene metal interconnect formation process may include, for example, forming a tantalum nitride liner 1 to 5 nanometers thick in the trenches 220, 224 and 232 by an atomic layer deposition (ALD) process, forming a copper seed layer 5 to 80 nanometers thick on the liner by sputtering, electroplating copper on the seed layer so as to fill the trenches 220, 224 and 232, and subsequently removing copper and liner metal from a top surface of the dielectric layer 204 by a copper CMP process.

The metal interconnect lines 236 are disposed in an interconnect level of the integrated circuit 200 defined by the first interconnect pattern 210 and the second interconnect pattern 226. A first lead 238, a crossover lead 240 and a second lead 242 are formed by the damascene metal interconnect formation process in areas defined by the first lead pattern 214, the crossover pattern 216 and the second lead pattern 230, respectively, so as to form a continuous metal crossover line from the first plurality 206 of parallel route tracks to the second plurality 208 of parallel route tracks. The exclusion zone 218 is free of metal interconnect lines 236.

Figure 3A:
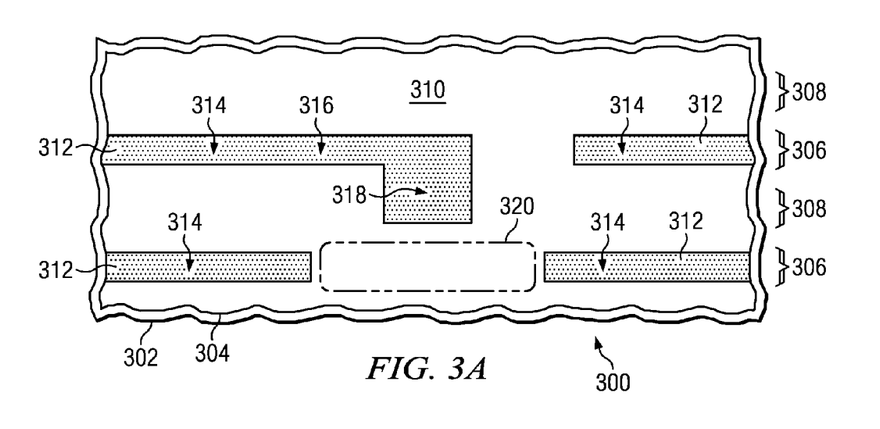
FIG. 3A through FIG. 3D are top views of an integrated circuit formed according a first embodiment using an etched metal process and an illumination source with a dipole component, depicted in successive stages of fabrication.

FIG. 3A through FIG. 3D are top views of an integrated circuit formed according a first embodiment using an etched metal process and an illumination source with a dipole component, depicted in successive stages of fabrication. The instant embodiment uses an illumination source with a dipole component, for example any of the illuminations sources described in reference to FIG. 1A through FIG. 1C. Referring to FIG. 3A, the integrated circuit 300 is formed in and on a semiconductor substrate 202, as described in reference to FIG. 2A. A dielectric layer 304 is formed over the substrate 202, including a PMD layer as described in reference to FIG. 2A, and possibly an intra-metal dielectric (IMD) layer. The IMD layer may include, for example, an etch stop layer of 5 to 25 nanometers of silicon nitride, silicon carbide, or silicon carbide nitride, a main layer of 80 to 160 nanometers of low-k dielectric material or ultra low-k dielectric material, and a cap layer of 10 to 40 nanometers of silicon nitride, silicon carbide nitride or silicon carbide. Areas for a first plurality 306 and a second plurality 308 of parallel route tracks are defined over the integrated circuit 300. Instances of the first plurality 306 of parallel route tracks alternate with instances of the second plurality 308 of parallel route tracks.

An interconnect metal layer 310 is formed over the dielectric layer 304. The interconnect metal layer 310 may include, for example, an adhesion layer of titanium tungsten or titanium nitride 3 to 15 nanometers thick formed by a metal organic chemical vapor deposition (MOCVD) process, a sputtered aluminum layer with 0.5 to 2 percent copper, silicon and/or titanium 100 to 200 nanometers thick, and a titanium nitride cap layer 5 to 20 nanometers thick formed by an MOCVD process.

A first interconnect pattern 312, depicted in FIG. 3A with a stipple pattern, is formed of photoresist over the interconnect metal layer 310 which creates a first plurality of masked areas 314 in the first plurality 306 of parallel route tracks. The first plurality of masked areas 314 includes a first lead pattern 316 in an instance of the first plurality 306 of parallel route tracks. The first interconnect pattern 312 further includes a crossover pattern 318 which extends from the first lead pattern 316 to an instance of the second plurality 308 of parallel route tracks immediately adjacent to the first lead pattern 316. The first interconnect pattern 312 may be formed using a positive tone develop process or a negative tone develop process, as described in reference to FIG. 2A. An exclusion zone 320 is defined in an instance of the first plurality 306 of parallel route tracks immediately adjacent to the crossover pattern 318 and extends for a lateral distance of two to three times a width of the crossover pattern 318 in a direction parallel to the first plurality 306 and the second plurality 308 of parallel route tracks. The exclusion zone 320 is free of the masked areas 314.

In the instant embodiment, due to the dipole component of the illumination sources used to produce the first interconnect pattern 312, a width of the crossover pattern 318 in a direction parallel to the first plurality 306 and second plurality 308 of parallel route tracks may be three to four times a minimum width of instances of the first lead pattern 316. In one version of the instant embodiment, the illumination source may provide 193 nanometer radiation, and the minimum width of the first lead pattern 316 may be 19 to 21 nanometers.

Figure 3B:
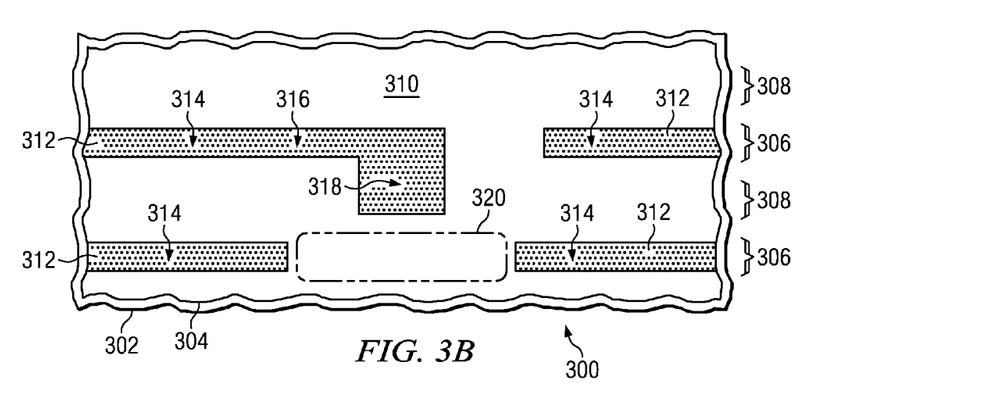

Referring to FIG. 3B, a resist freeze process is performed which hardens the first interconnect pattern 312 so as to allow a second photoresist pattern to be formed on the integrated circuit 300. The first interconnect pattern 312 after completion of the resist freeze process is depicted in FIG. 3B with a coarse stipple pattern. The litho freeze process may include, for example, an ultraviolet (UV) cure step, a thermal cure step and/or a chemical cure step.

Figure 3C:
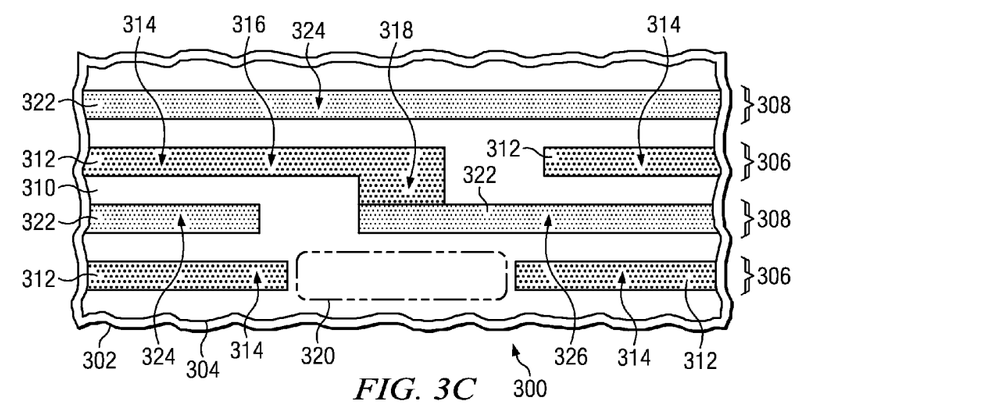

Referring to FIG. 3C, a second interconnect pattern 322, depicted in FIG. 3C with a stipple pattern, is formed of photoresist over the interconnect metal layer 310 which creates a second plurality of masked areas 324 in the second plurality 308 of parallel route tracks. The second plurality of masked areas 324 includes a second lead pattern 326 in an instance of the second plurality 308 of parallel route tracks which extends to the crossover pattern 318. The second interconnect pattern 322 may be formed using a positive tone develop process or a negative tone develop process, as described in reference to FIG. 2A.

Figure 3D:
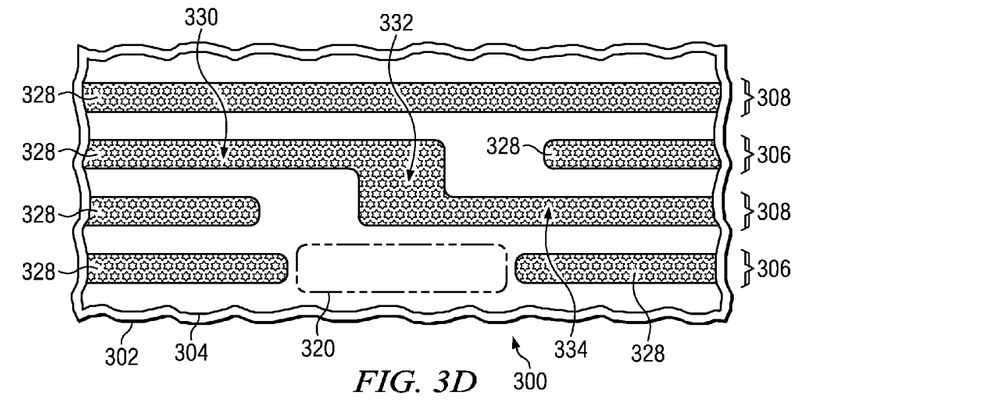

Referring to FIG. 3D, a metal etch process is performed which removes metal from the interconnect metal layer 310 outside of the first interconnect pattern 312 and the second interconnect pattern 322 so as to form metal interconnect lines 328, depicted in FIG. 3D with a star hatch pattern. The metal etch process may include, for example an RIE step with a chlorine-containing plasma to etch the aluminum. The metal interconnect lines 328 are disposed in an interconnect level of the integrated circuit 300 defined by the first interconnect pattern 312 and the second interconnect pattern 322. A first lead 330, a crossover lead 332 and a second lead 334 are formed by the metal etch process in areas defined by the first lead pattern 316, the crossover pattern 318 and the second lead pattern 326, respectively, so as to form a continuous metal crossover line from the first plurality 306 of parallel route tracks to the second plurality 308 of parallel route tracks. The exclusion zone 320 is free of metal interconnect lines 328.

Figure 4A:
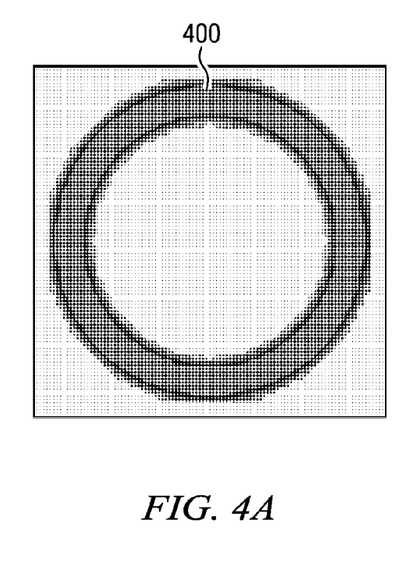
FIG. 4A through FIG. 4C depict additional exemplary illumination sources for photolithographic processes which may be used to form integrated circuits according to embodiments described herein.
Figure 4B:
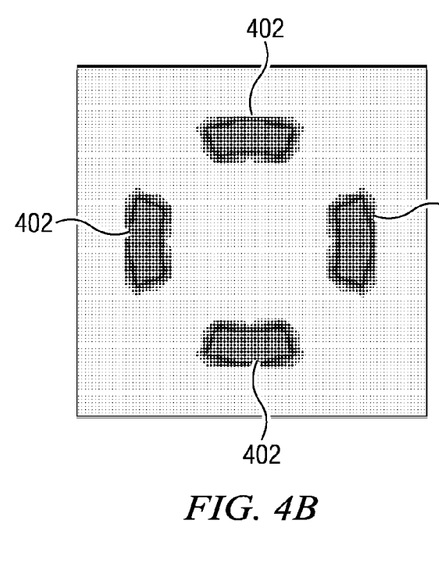
Figure 4C:
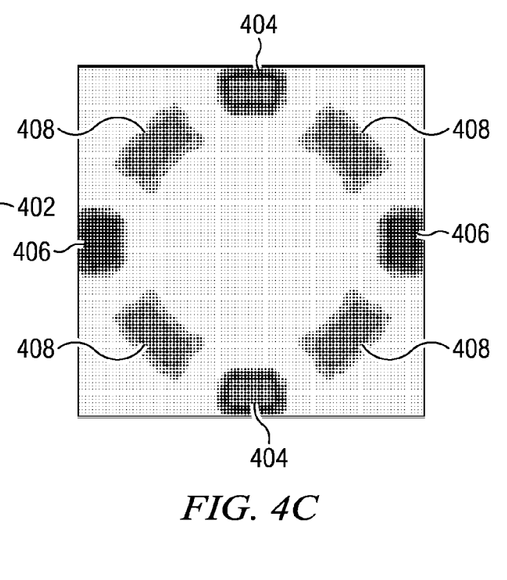

FIG. 4A through FIG. 4C depict additional exemplary illumination sources for photolithographic processes which may be used to form integrated circuits according to embodiments described herein. FIG. 4A depicts an isotropic off-axis illumination source, in which the emitting area 400 has an annular configuration. FIG. 4B depicts a quadruple off-axis illumination source, in which the emitting area 402 is configured in four regions uniformly spaced around an optical axis of the illumination source so as to provide substantially equal spatial resolution in both horizontal and vertical directions. FIG. 4C depicts a composite dipole-quadrupole-octopole off-axis illumination source, in which the emitting area is configured in two strong emitting regions 404 along the vertical direction, two moderate emitting regions 406 along the horizontal direction, and four weak emitting regions 408 along diagonal directions.

Figure 5A:
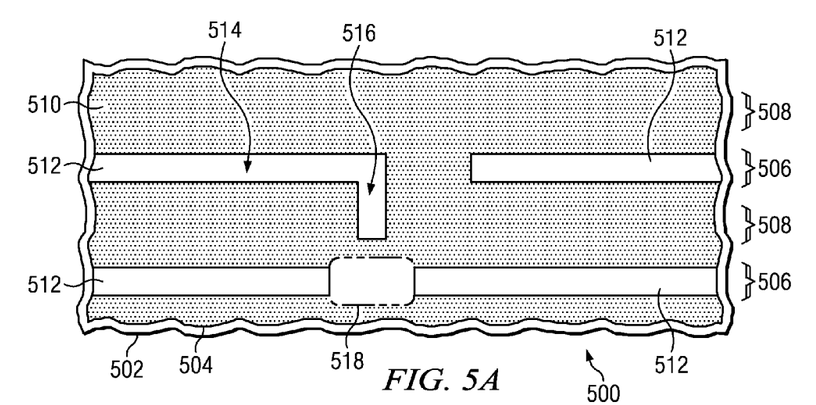
FIG. 5A through FIG. 5E are top views of an integrated circuit formed according a first embodiment using a damascene metal process and an isotropic illumination source, depicted in successive stages of fabrication.

FIG. 5A through FIG. 5E are top views of an integrated circuit formed according a first embodiment using a damascene metal process and an isotropic illumination source, depicted in successive stages of fabrication. The instant embodiment uses a substantially isotropic illumination source, for example any of the illuminations sources described in reference to FIG. 4A through FIG. 4C. Referring to FIG. 5A, the integrated circuit 500 is formed in and on a semiconductor substrate 502, as described in reference to FIG. 2A. A dielectric layer 504 is formed over the substrate 502, as described in reference to FIG. 2A. Areas for a first plurality 506 and a second plurality 508 of parallel route tracks are defined over the integrated circuit 500. Instances of the first plurality 506 of parallel route tracks alternate with instances of the second plurality 508 of parallel route tracks.

A first interconnect pattern 510, depicted in FIG. 5A with a stipple pattern, is formed of photoresist over the dielectric layer 504 which creates a first plurality of exposed areas 512 in the first plurality 506 of parallel route tracks, as described in reference to FIG. 2A. The first plurality of exposed areas 512 includes a first lead pattern 514 in an instance of the first plurality 506 of parallel route tracks. The first interconnect pattern 510 further includes a crossover pattern 516 which extends from the first lead pattern 514 to an instance of the second plurality 508 of parallel route tracks immediately adjacent to the first lead pattern 514. An exclusion zone 518 is defined in an instance of the first plurality 506 of parallel route tracks immediately adjacent to the crossover pattern 516 and extends for a lateral distance of two to three times a width of the crossover pattern 516 in a direction parallel to the first plurality 506 and the second plurality 508 of parallel route tracks. The exclusion zone 518 is free of the exposed areas 512. In the instant embodiment, due to the isotropic configuration of the illumination sources used to produce the first interconnect pattern 510, a width of the crossover pattern 516 in a direction parallel to the first plurality 506 and second plurality 508 of parallel route tracks may be one to four times a minimum width of the first lead pattern 514. In one version of the instant embodiment, the illumination source may provide 193 nanometer radiation, and the width of the first lead pattern 514 may be 30 to 37 nanometers.

Figure 5B:
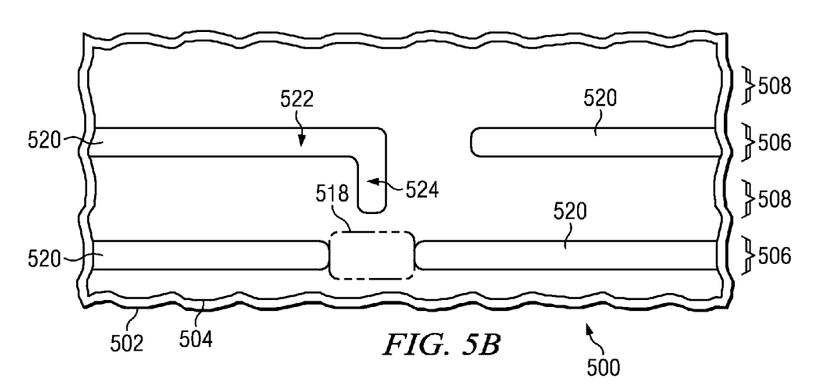

Referring to FIG. 5B, a first interconnect trench etch process is performed as described in reference to FIG. 2B, to form a first plurality of interconnect trenches 520, including a first lead trench 522 in the first lead pattern 514 and a crossover trench 524 in the crossover pattern 216.

Figure 5C:
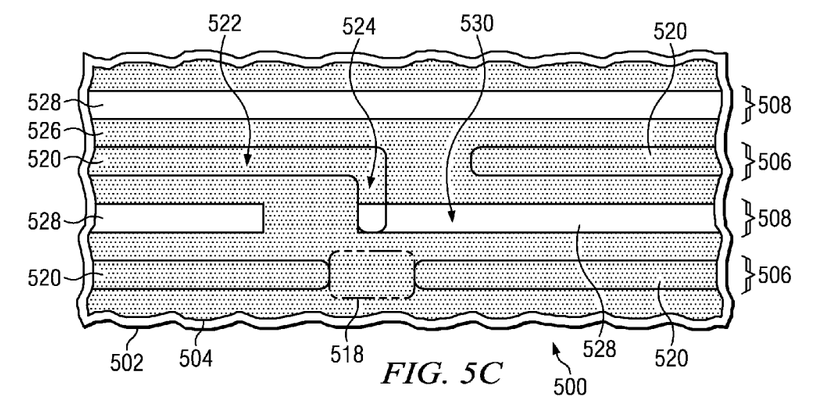

Referring to FIG. 5C, a second interconnect pattern 526, depicted in FIG. 5C with a stipple pattern, is formed of photoresist over the dielectric layer 504 as described in reference to FIG. 2C which creates a second plurality of exposed areas 528 in the second plurality 508 of parallel route tracks, including a second lead pattern 530 which extends to the crossover trench 524.

Figure 5D:
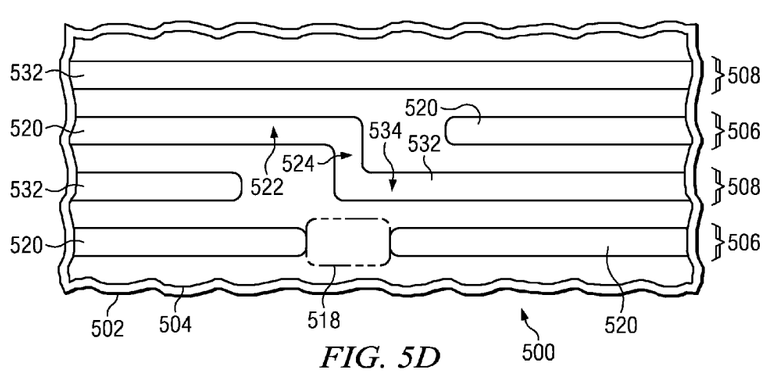

Referring to FIG. 5D, a second interconnect trench etch process is performed as described in reference to FIG. 2B to form a second plurality of interconnect trenches 532, including a second lead trench 534 in the second lead pattern 530. The first lead trench 522, the crossover trench 524 and the second lead trench 534 form a continuous trench.

Figure 5E:
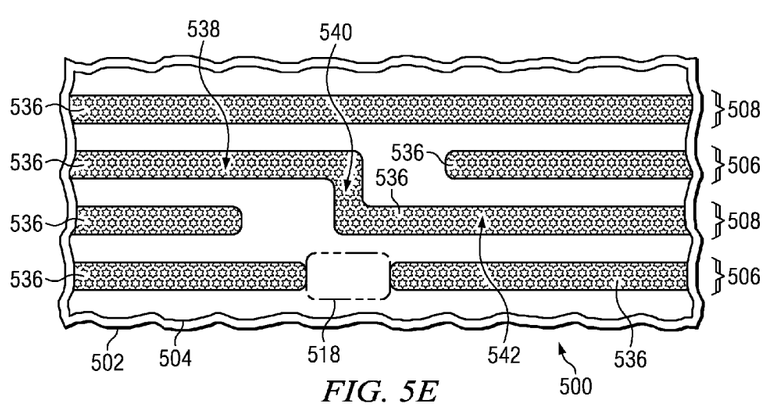

Referring to FIG. 5E, a damascene metal interconnect formation process is performed as described in reference to FIG. 2E which forms metal interconnect lines 536, depicted in FIG. 2E with a star hatch pattern, in the first plurality of interconnect trenches 520, the crossover trench 524 and the second plurality of interconnect trenches 532. The metal interconnect lines 536 are disposed in an interconnect level of the integrated circuit 500 defined by the first interconnect pattern 510 and the second interconnect pattern 526. A first lead 538, a crossover lead 540 and a second lead 542 are formed by the damascene metal interconnect formation process in areas defined by the first lead pattern 514, the crossover pattern 516 and the second lead pattern 530, respectively, so as to form a continuous metal crossover line from the first plurality 506 of parallel route tracks to the second plurality 508 of parallel route tracks. The exclusion zone 518 is free of metal interconnect lines 536.

Figure 6A:
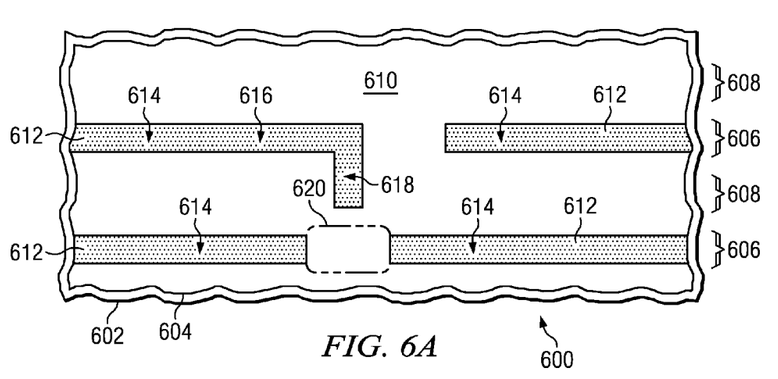
FIG. 6A through FIG. 6D are top views of an integrated circuit formed according a first embodiment using an etched metal process and an isotropic illumination source, depicted in successive stages of fabrication.

FIG. 6A through FIG. 6D are top views of an integrated circuit formed according a first embodiment using an etched metal process and an isotropic illumination source, depicted in successive stages of fabrication. The instant embodiment uses a substantially isotropic illumination source, for example any of the illuminations sources described in reference to FIG. 4A through FIG. 4C. Referring to FIG. 6A, the integrated circuit 600 is formed in and on a semiconductor substrate 602, as described in reference to FIG. 3A. A dielectric layer 604 including a PMD layer is formed over the substrate 602, as described in reference to FIG. 3A. Areas for a first plurality 606 and a second plurality 608 of parallel route tracks are defined over the integrated circuit 600. Instances of the first plurality 606 of parallel route tracks alternate with instances of the second plurality 608 of parallel route tracks. An interconnect metal layer 610 is formed over the dielectric layer 604 as described in reference to FIG. 3A.

A first interconnect pattern 612, depicted in FIG. 6A with a stipple pattern, is formed of photoresist over the interconnect metal layer 610 as described in reference to FIG. 3A which creates a first plurality of masked areas 614 in the first plurality 606 of parallel route tracks, including a first lead pattern 616 in an instance of the first plurality 606 of parallel route tracks and a crossover pattern 618 which extends from the first lead pattern 616 to an instance of the second plurality 608 of parallel route tracks immediately adjacent to the first lead pattern 616. An exclusion zone 620 is defined in an instance of the first plurality 606 of parallel route tracks immediately adjacent to the crossover pattern 618 and extends for a lateral distance of two to three time a width of the crossover pattern 618 in a direction parallel to the first plurality 606 and the second plurality 608 of parallel route tracks. The exclusion zone 620 is free of the masked areas 614. In the instant embodiment, due to the isotropic configuration of the illumination sources used to produce the first interconnect pattern 612, a width of the crossover pattern 618 in a direction parallel to the first plurality 606 and second plurality 308 of parallel route tracks may be one to four times a width of the first lead pattern 616. In one version of the instant embodiment, the illumination source may provide 193 nanometer radiation, and the width of instances of the first lead pattern 616 may be 30 to 37 nanometers.

Figure 6B:
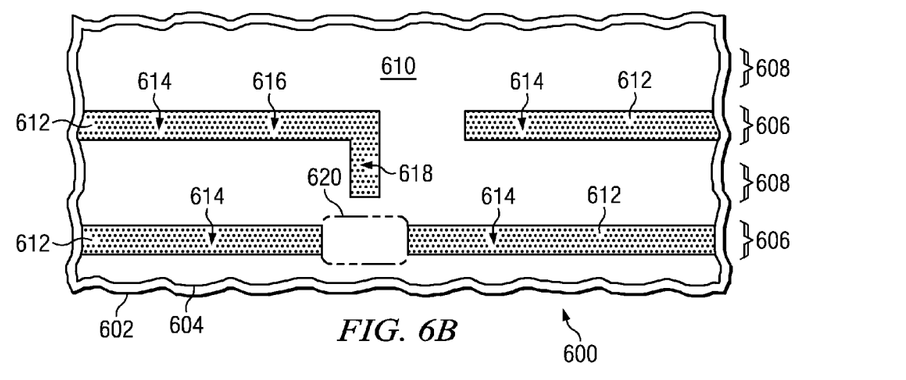

Referring to FIG. 6B, a resist freeze process is performed which hardens the first interconnect pattern 612 as described in reference to FIG. 3B so as to allow a second photoresist pattern to be formed on the integrated circuit 600. The first interconnect pattern 612 after completion of the resist freeze process is depicted in FIG. 6B with a coarse stipple pattern.

Figure 6C:
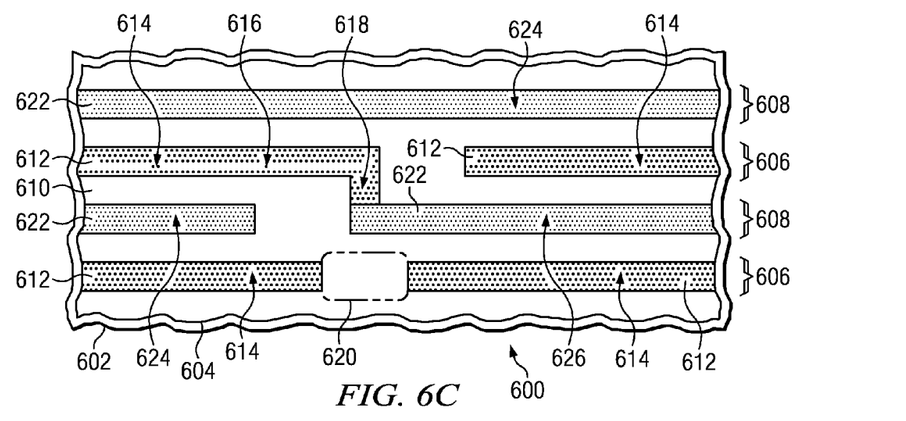

Referring to FIG. 6C, a second interconnect pattern 622, depicted in FIG. 6A with a stipple pattern, is formed of photoresist over the interconnect metal layer 610 as described in reference to FIG. 3C which creates a second plurality of masked areas 624 in the second plurality 608 of parallel route tracks, including a second lead pattern 626 in an instance of the second plurality 608 of parallel route tracks which extends to the crossover pattern 618.

Figure 6D:
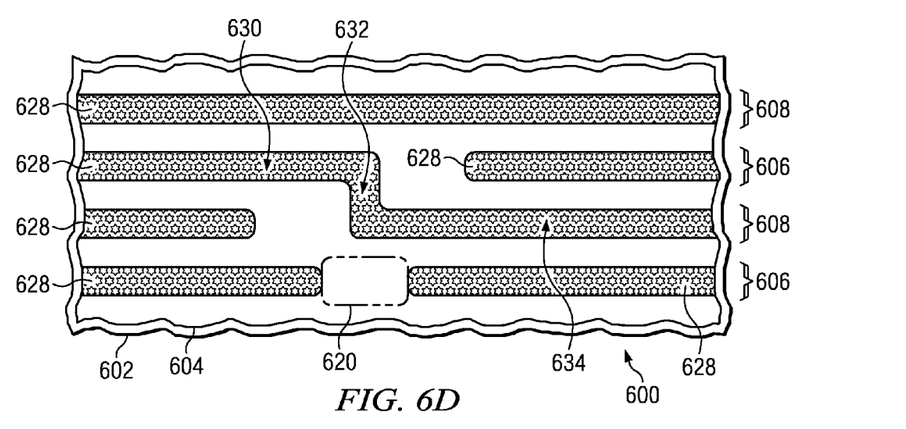

Referring to FIG. 6D, a metal etch process is performed as described in reference to FIG. 3D to form metal interconnect lines 628, depicted in FIG. 6D with a star hatch pattern, including a first lead 630, a crossover lead 632 and a second lead 634 in areas defined by the first lead pattern 616, the crossover pattern 618 and the second lead pattern 626, respectively, so as to form a continuous metal crossover line from the first plurality 606 of parallel route tracks to the second plurality 608 of parallel route tracks. The metal interconnect lines 628 are disposed in an interconnect level of the integrated circuit 600 defined by the first interconnect pattern 612 and the second interconnect pattern 622. The exclusion zone 620 is free of metal interconnect lines 628.

Figure 7A:
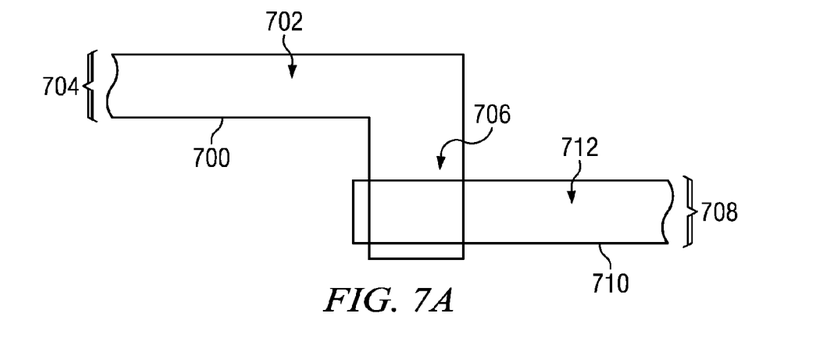
FIG. 7A through FIG. 7C depict possible configurations of first and second interconnect patterns to form crossover patterns.
Figure 7B:
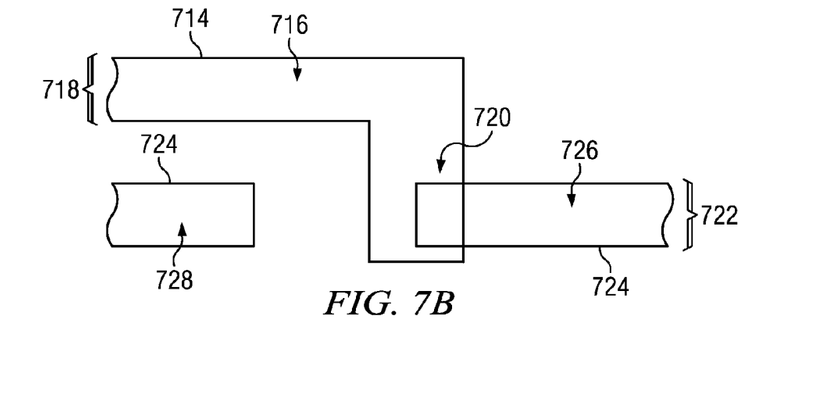
Figure 7C:
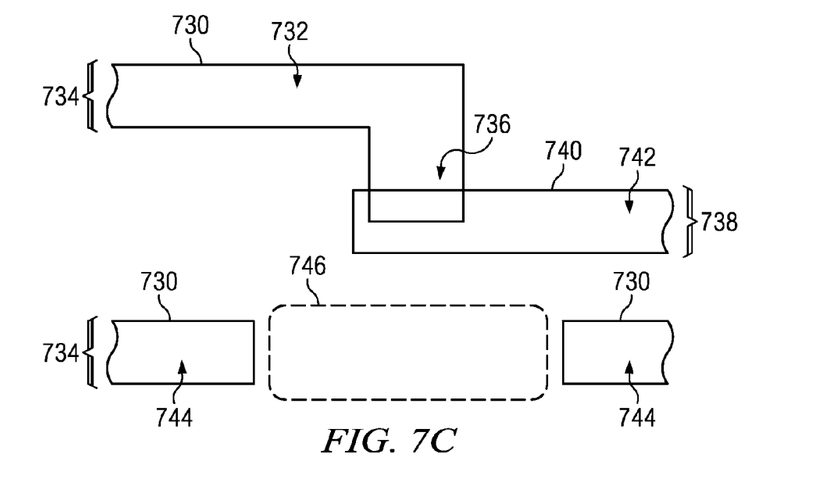

FIG. 7A through FIG. 7C depict possible configurations of first and second interconnect patterns to form crossover patterns. Referring to FIG. 7A, a first interconnect pattern 700 includes a first lead pattern 702 in an instance of a first plurality of parallel route tracks 704 and a crossover pattern 706 which extends from the first lead pattern 702 to an instance of a second plurality of parallel route tracks 708 immediately adjacent to the instance of the first plurality of parallel route tracks 704. A second interconnect pattern 710 includes a second lead pattern 712 in the instance of the second plurality of parallel route tracks 708 extending to the crossover pattern 706. In the instant embodiment, the second lead pattern 712 extends past an area for the crossover pattern 706, and the crossover pattern 706 extends past an area for the second lead pattern 712. The first interconnect pattern 700 and the second interconnect pattern 710 may be used to form a continuous metal crossover line as described in reference to FIG. 2A through FIG. 2E, FIG. 3A through FIG. 3D, FIG. 5A through FIG. 5E and/or FIG. 6A through FIG. 6D. Configuring the crossover pattern 706 and the second lead pattern 712 to extend past each other may advantageously provide a lower resistance crossover line compared to crossover lines formed by other configurations of the crossover pattern 706 and the second lead pattern 712.

Referring to FIG. 7B, a first interconnect pattern 714 includes a first lead pattern 716 in an instance of a first plurality of parallel route tracks 718 and a crossover pattern 720 which extends from the first lead pattern 716 to an instance of a second plurality of parallel route tracks 722 immediately adjacent to the instance of the first plurality of parallel route tracks 718. A second interconnect pattern 724 includes a second lead pattern 726 and an adjacent third lead pattern 728 in the instance of the second plurality of parallel route tracks 722 extending to the crossover pattern 720. In the instant embodiment, the second lead pattern 726 extends partway into an area for the crossover pattern 720, and the crossover pattern 720 extends past an area for the second lead pattern 726. The first interconnect pattern 714 and the second interconnect pattern 724 may be used to form a continuous metal crossover line as described in reference to FIG. 2A through FIG. 2E, FIG. 3A through FIG. 3D, FIG. 5A through FIG. 5E and/or FIG. 6A through FIG. 6D. Configuring the second lead pattern 726 to extend partway into the crossover pattern 720 may advantageously provide a shorter distance to the adjacent third lead pattern 728 compared other configurations of the crossover pattern 720 and the second lead pattern 726.

Referring to FIG. 7C, a first interconnect pattern 730 includes a first lead pattern 732 in a first instance of a first plurality of parallel route tracks 734 and a crossover pattern 736 which extends from the first lead pattern 732 to an instance of a second plurality of parallel route tracks 738 immediately adjacent to the instance of the first plurality of parallel route tracks 734. A second interconnect pattern 740 includes a second lead pattern 742 in the instance of the second plurality of parallel route tracks 738 extending to the crossover pattern 736. The first interconnect pattern 730 further includes additional lead patterns 744 in a second instance of the first plurality of parallel route tracks 734 immediately adjacent to the second lead pattern 742 and opposite from the first lead pattern 732. The additional lead patterns 744 do not extend into an exclusion zone 746 in the second instance of the first plurality of parallel route tracks 734 immediately adjacent to the crossover pattern 736 as described in reference to FIG. 2A, FIG. 3A, FIG. 5A and/or FIG. 6A. In the instant embodiment, the second lead pattern 742 extends past an area for the crossover pattern 736, and the crossover pattern 736 extends partway into an area for the second lead pattern 742. The first interconnect pattern 730 and the second interconnect pattern 740 may be used to form a continuous metal crossover line as described in reference to FIG. 2A through FIG. 2E, FIG. 3A through FIG. 3D, FIG. 5A through FIG. 5E and/or FIG. 6A through FIG. 6D. Configuring the crossover pattern 736 to extend partway into the second lead pattern 742 may advantageously provide a shorter exclusion zone 746 compared other configurations of the crossover pattern 736 and the second lead pattern 742.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:
forming a dielectric layer over a substrate;
defining areas for a first plurality of parallel route tracks and second plurality of parallel route tracks on a top surface of said dielectric layer, so that instances of said second plurality of parallel route tracks alternate with instances of said first plurality of parallel route tracks;
forming a first interconnect pattern creating a plurality of first exposed areas in said first plurality of parallel route tracks, said plurality of first exposed areas including a first lead pattern and a crossover pattern which extends from said first lead pattern, such that an exclusion zone is defined in an instance of said first plurality of parallel route tracks immediately adjacent to said crossover pattern opposite said first lead pattern and extends for a lateral distance of two to three times a width of said crossover pattern in a direction parallel to said first plurality of parallel route tracks, said exclusion zone being free of instances of said first plurality of exposed areas;
performing a first trench etch process to form a first plurality of trenches in said plurality of first exposed areas, including a first lead trench in said first lead pattern, and a crossover trench in said crossover pattern;
forming a second interconnect pattern creating a plurality of second exposed areas in said second plurality of parallel route tracks, said second plurality of exposed areas including a second lead pattern which extends to said crossover trench;
wherein said first interconnect pattern and said second interconnect pattern are formed using two distinct photolithography processes;
performing a second trench etch process to form a second plurality of trenches in said second plurality of exposed areas, including a second lead trench in said second lead pattern, so that said first lead trench, said crossover trench and said second lead trench form a continuous trench; and
forming metal interconnect lines in said first plurality of trenches, said crossover trench and said second plurality of trenches.

2. The process of claim 1, in which:
said first interconnect pattern is formed using an illumination source with an isotropic configuration; and
said width of said crossover pattern in said direction parallel to said first plurality of parallel route tracks is one to four times a width of said first lead pattern.

3. The process of claim 2, in which
said illumination source provides 193 nanometer radiation; and
said width of said first lead pattern is 30 to 37 nanometers.

4. The process of claim 1, in which:
said first interconnect pattern is formed using an illumination source with a dipole component; and
said width of said crossover pattern in said direction parallel to said first plurality of parallel route tracks is three to four times a width of said first lead pattern.

5. The process of claim 4, in which:
said illumination source provides 193 nanometer radiation; and
said width of said first lead pattern is 19 to 21 nanometers.

6. The process of claim 1, in which:
said second lead pattern extends past an area for said crossover pattern; and
said crossover pattern extends past an area for said second lead pattern.

7. The process of claim 1, in which:
said second lead pattern extends partway into an area for said crossover pattern; and
said crossover pattern extends past an area for said second lead pattern.

8. The process of claim 1, in which:
said second lead pattern extends past an area for said crossover pattern; and
said crossover pattern extends partway into an area for said second lead pattern.

9. A process of forming an integrated circuit, comprising the steps of:
forming a dielectric layer over a substrate;
defining areas for a first plurality of parallel route tracks and second plurality of parallel route tracks on a top surface of said dielectric layer, so that instances of said second plurality of parallel route tracks alternate with instances of said first plurality of parallel route tracks;
forming an interconnect metal layer over said dielectric layer;
forming a first interconnect pattern over said interconnect metal layer, said first interconnect pattern including a first plurality of masked areas in said first plurality of parallel route tracks, including a first lead pattern and a crossover pattern which extends from said first lead pattern, such that an exclusion zone is defined in an instance of said first plurality of parallel route tracks immediately adjacent to said crossover pattern opposite said first lead pattern and extends for a lateral distance of two to three times a width of said crossover pattern in a direction parallel to said first plurality of parallel route tracks, said exclusion zone being free of instances of said first plurality of exposed areas;
performing a resist freeze process which hardens said first interconnect pattern;
after performing said resist freeze operation, forming a second interconnect pattern over said interconnect metal layer, said second interconnect pattern including a second plurality of masked areas in said second plurality of parallel route tracks, said second plurality of masked areas including a second lead pattern which extends to said crossover pattern;
etching said interconnect metal layer to form metal interconnect lines, including a first lead defined by said first lead pattern, a crossover lead defined by said crossover pattern, and a second lead defined by said second lead pattern, so that said first lead, said crossover lead, and said second lead form a continuous metal crossover line from said first plurality of parallel route tracks to said second plurality of parallel route tracks.

10. The process of claim 9, in which:
said first interconnect pattern is formed using an illumination source with an isotropic configuration; and
said width of said crossover pattern in said direction parallel to said first plurality of parallel route tracks is one to four times a width of said first lead pattern.

11. The process of claim 10, in which
said illumination source provides 193 nanometer radiation; and
said width of said first lead pattern is 30 to 37 nanometers.

12. The process of claim 9, in which:
said first interconnect pattern is formed using an illumination source with a dipole component; and said width of said crossover pattern in said direction parallel to said first plurality of parallel route tracks is three to four times a width of said first lead pattern.

13. The process of claim 12, in which:

said illumination source provides 193 nanometer radiation; and said width of said first lead pattern is 19 to 21 nanometers.

14. The process of claim 9, in which:

said second lead pattern extends past an area for said crossover pattern; and said crossover pattern extends past an area for said second lead pattern.

15. The process of claim 9, in which:

said second lead pattern extends partway into an area for said crossover pattern; and said crossover pattern extends past an area for said second lead pattern.

16. The process of claim 9, in which:

said second lead pattern extends past an area for said crossover pattern; and said crossover pattern extends partway into an area for said second lead pattern.

* * * * *